United States Patent [19]

Hayashi

[11] Patent Number: 5,097,145

[45] Date of Patent: Mar. 17, 1992

[54] LIGHT EMITTING ELEMENT DRIVE CIRCUIT

[75] Inventor: Shigeo Hayashi, Kanagawa, Japan

[73] Assignee: Sumitomo Electric Industries, Ltd., Osaka, Japan

[21] Appl. No.: 697,985

[22] Filed: May 10, 1991

[30] Foreign Application Priority Data

Aug. 2, 1990 [JP] Japan .................................. 2-205772

[51] Int. Cl.$^5$ ................................................ H03K 3/42
[52] U.S. Cl. ...................................... 307/311; 307/355
[58] Field of Search .................... 307/311, 273, 355; 372/38

[56] References Cited

U.S. PATENT DOCUMENTS

| | | | |
|---|---|---|---|
| 4,647,792 | 3/1987 | Meslener et al. | 307/311 X |
| 4,806,803 | 2/1989 | Yamashita | 307/355 X |
| 4,818,896 | 4/1989 | Cavanna | 307/355 X |

Primary Examiner—Stanley D. Miller
Assistant Examiner—Toan Tran
Attorney, Agent, or Firm—Cushman, Darby & Cushman

[57] ABSTRACT

A light emitting element drive circuit which has high operation speed, low current consumption and provides an optical output signal with minimum distortion. An inverted input signal is applied to a second transistor which drives a differentiating circuit. The differentiating circuit drives a third transistor which provides a current path for discharging the light emitting element. The light emitting element discharges when the input signal falls. The input of the differentiating circuit and the input of the light emitting element drive circuit are isolated to prevent "back gating" distortion of the optical signal.

6 Claims, 3 Drawing Sheets

FIG. 3 PRIOR ART
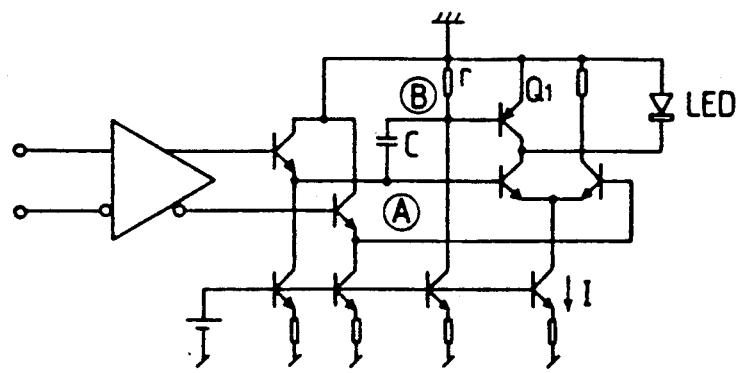
FIG. 4
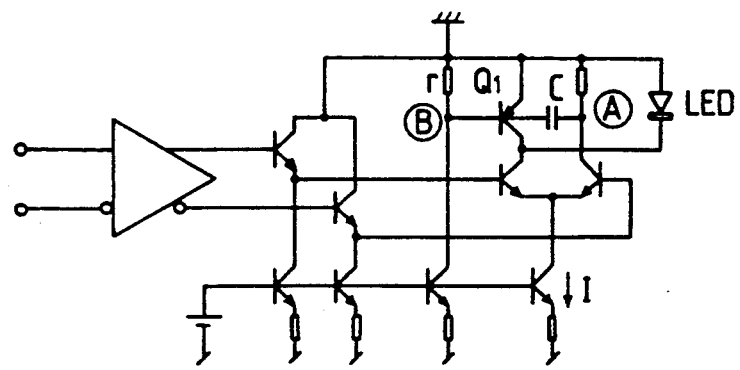
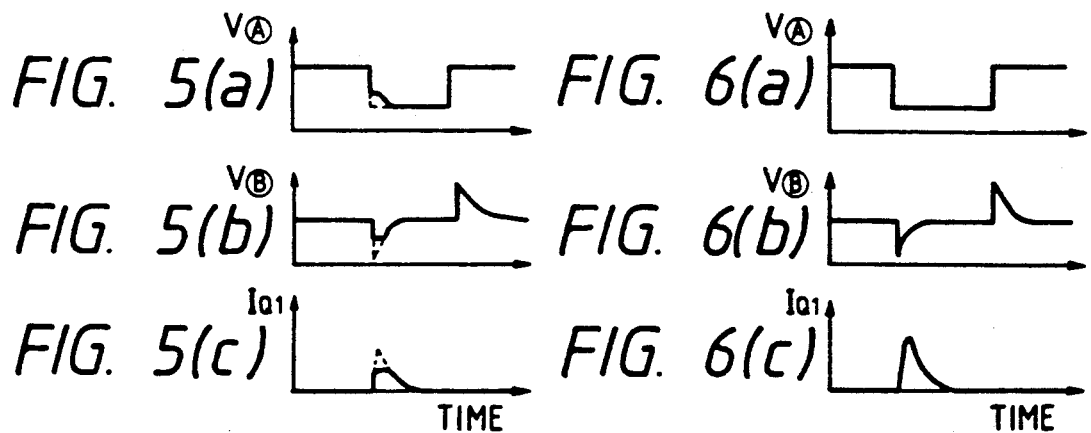

LIGHT EMITTING ELEMENT DRIVE CIRCUIT

BACKGROUND OF THE INVENTION

1. Field of the Invention

This invention relates to light emitting element drive circuits. More particularly, the invention is directed to a light emitting element drive circuit that is low in power consumption and provides a light output of high quality. The invention is useful in optical communication systems 2. Description of the Related Art Typically, an optical communication system includes an optical transmitter and an optical receiver. In the transmitter, a drive circuit applies a data-modulated drive current to a light emitting element, which optically transmits the data. It is desirable that this light emitting element drive circuit is consume little power and be able to handle high data rates such as 100 Mbps.

An LED (light emitting diode), which is a typical example of the light emitting element, has a relatively large capacitance. Therefore, when its drive signal charges from a "light" state to a "no light" state, a relatively long period of time elapses before the light emission ceases. To cope with this problem, the LED may be driven by a complementary drive system as disclosed by Japanese Patent Application 234568/1988 (unexamined, but published).

FIG. 2 (prior art) shows the typical arrangement of the conventional light emitting element drive circuit.

The conventional light emitting element drive circuit of FIG. 2 essentially comprises a pair of NPN transistors $Q_1$ and $Q_1$, the emitters of which are commonly connected to a current source I, and a PNP transistor $Q_3$, the base of which is connected through a capacitor $C_1$ to the base of the transistor $Q_1$. The collector of the transistor $Q_1$ is grounded through a light emitting diode LED. The collector of the transistor $Q_3$ is connected to the collector of the transistor $Q_1$. The emitter of the transistor $Q_3$ and the collector of the transistor $Q_4$ are grounded. An input signal SD and its inverted signal $\overline{SD}$ are applied to the bases of the transistors $Q_1$ and $Q_1$, respectively. A bias is applied through a resistor $R_1$ to the base of the transistor $Q_3$.

The conventional drive circuit operates as follows: When the input signal SD rises, transistor $Q_1$ conducts. Current flows through the light emitting diode LED and the optical signal output of the diode rises. When the input signal SD falls, the transistor $Q_1$ is rendered non-conductive so that the application of current to the light emitting diode LED is interrupted. At the same time, the inverted signal $\overline{SD}$ rises to render the transistor $Q_2$ conductive so that current flows through the conductive transistor $Q_2$.

Input signal SD is applied to the base of the transistor $Q_3$ through a differentiating circuit including resistor $R_1$ and a capacitor $C_1$. When the input signal SD falls, the transistor $Q_3$ is rendered conductive so that the light emitting diode LED is discharged through the transistor $Q_3$, thus minimizing the amount of time that elapses before the output optical signal attributed to the capacitance of the light emitting diode LED ceases.

The circuit that outputs the signal SD which is applied to the differentiating circuit made up of the resistor $R_1$ and the capacitor $C_1$ must be low in impedance. Therefore, the current consumption is unavoidably increased.

Because the base of the transistor $Q_1$ which drives the light emitting diode LED directly is coupled to the base of the transistor $Q_3$, the waveform of the output optical signal is likely to be deteriorated by so called "back gating".

SUMMARY OF THE INVENTION

Accordingly, an object of the present invention is to eliminate the above-described problems attendant a conventional light emitting element drive circuit. More specifically, an object of the invention is to provide a novel light emitting element drive circuit which is high in operation speed, low in current consumption, and provides an output optical signal waveform with minimal distortion.

This objective of the invention has been achieved by providing of a light emitting element drive circuit comprising a current source circuit and a light emitting element whose anode is connected to a high voltage side and whose cathode is connected to the collector of a first NPN transistor. An input signal is applied to the base of the first NPN transistor, and the emitter of the first NPN transistor is connected to the current source circuit. The circuit also includes a second NPN transistor to the base of which an inverted signal of the input signal is applied. The collector of the second NPN transistor is connected to the high voltage side and the emitter is connected to the current source circuit in common with the emitter of the first NPN transistor. The circuit further comprises a differentiating circuit including a capacitor with one terminal connected to the collector of the second NPN transistor and a resistor with one terminal connected to the other terminal of the capacitor. A bias is applied to the other terminal of the resistor. Also, the collector of a PNP transistor is connected to the connecting point of the cathode of the light emitting element and the collector of the first NPN transistor. The emitter of the PNP transistor is connected to the high voltage side and the base of the PNP transistor is connected to the terminals of the capacitor and resistor which represent the output point of the differentiating circuit.

The specific feature of the light emitting element drive circuit is that the transistor which forms a current path for discharging the light emitting element is driven from the side of the circuit to which the light emitting element is not connected. That is, in the light emitting element drive circuit, to drive the light emitting element, current is applied in a select mode to the pairs of current paths made up of the first transistor whose load is the light emitting element and the second transistor which is directly connected to the high voltage side. In order to accelerate the discharge of the light emitting element, the third transistor forms a path for discharging the light emitting element. The third transistor is driven by the differentiation signal SD of the input signal SD.

As shown in FIG. 2 (prior art), in the conventional light emitting element drive circuit 10, the third transistor $Q_3$ is driven by the differentiating circuit connected to the signal input SD, and therefore it is essential that the signal circuit for supplying the input signal to the light emitting element LED drive circuit is low in output impedance. On the other hand, in the light emitting element drive circuit of the present invention, the input of the differentiating circuit is connected to the collector of the second transistor. Accordingly, the input of the differentiating circuit is sufficiently low in impedance, and it is unnecessary to reduce the output impedance of the signal circuit which supplies the input signal SD to the light emitting element drive circuit. Hence, the current consumption can be decreased.

As described above in the light emitting element drive circuit of the present invention, the input for the first transistor adapted to directly drive the light emitting element is isolated from the input for the differentiating circuit therefore eliminating the problem of the output optical signal being distorted by "back gating".

Also, in the light emitting element drive circuit of the present invention, the current source circuit is not particularly limited in arrangement. That is, the current source circuit may be formed by using elements such as diodes and transistors.

One embodiment of the light emitting element drive circuit according to the invention will be described with reference to FIG. 1; however, it should be noted that the invention is not limited technically to this preferred embodiment.

BRIEF DESCRIPTION OF THE DRAWINGS

Preferred embodiment(s) of the invention will be described in detail with reference to the drawings wherein like reference characters denote like or corresponding parts throughout.

FIG. 3 shows the details of the conventional light emitting element drive circuit in FIG. 2;

FIG. 4 shows the details of the light emitting element drive circuit in FIG. 1;

FIGS. 5(a) to 5(c) shows signal waveforms obtained by the circuit of FIG. 3, respectively;

FIGS. 6(a) to 6(b) shows signal waveforms obtained by the circuit of FIG. 4, respectively.

DETAILED DESCRIPTION OF THE PREFERRED EMBODIMENTS

Figure 1:
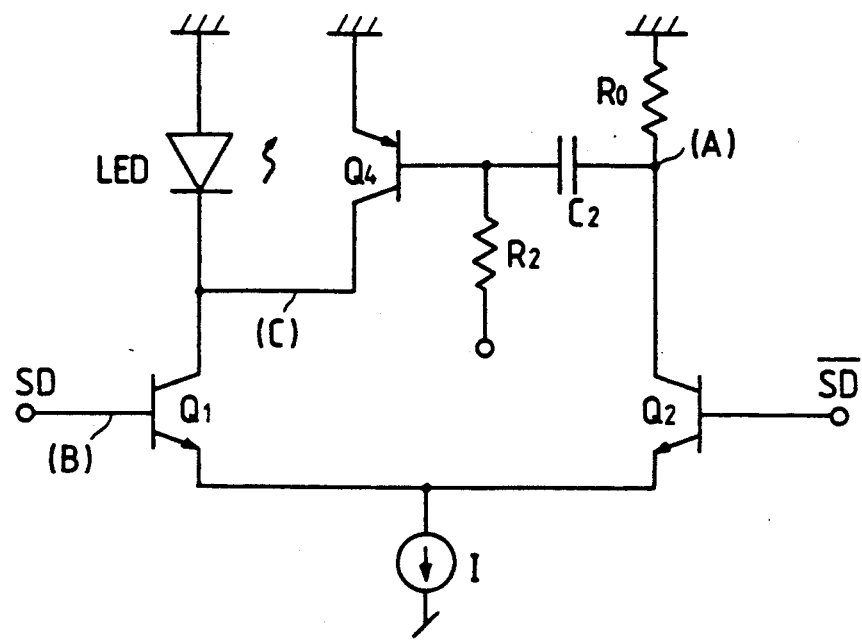
FIG. 1 is a circuit diagram showing a preferred embodiment of a light emitting element drive circuit according to this invention.

FIG. 1 shows the arrangement of one embodiment of a light emitting element drive circuit according to this invention.

The light emitting element drive circuit, as shown in FIG. 1, comprises: a current source I, a light emitting diode LED, a pair of NPN transistors $Q_1$ and $Q_2$ for controlling a drive current applied to the light emitting diode LED, a PNP transistor $Q_4$ providing a discharge path for the light emitting diode LED, and a differentiating circuit made up of a resistor $R_2$ and a capacitor $C_2$.

The anode of the light emitting diode LED is grounded. The collector of the transistor $Q_1$ is connected to the cathode of the light emitting diode LED, and the emitter of transistor $Q_1$ is connected to the current source I in common with transistor $Q_2$. An input signal SD is applied to the base of the transistor $Q_1$. The collector of the transistor $Q_2$ is grounded through a resistor $R_0$, and the emitter of transistor $Q_2$ is connected to the current source I. The inverted signal $\overline{SD}$ of the input signal SD is applied to the base of the transistor $Q_2$.

In the differentiating circuit, one terminal of the capacitor $C_2$, the input terminal of the differentiating circuit, is connected to the collector of the transistor $Q_2$. The other terminal of the capacitor $C_2$, the output terminal of the differentiating circuit, is connected to one terminal of the resistor $R_2$ and the base of the transistor $Q_4$. A bias is applied to the other terminal of the resistor $R_2$ to slightly bias the base of the transistor $Q_4$ in the forward the collector is connected to the cathode of the light emitting diode LED.

In the light emitting element drive circuit, when the input signal SD rises, the transistor $Q_1$ is rendered conductive, whereas the inverted signal $\overline{SD}$ falls to render the transistor $Q_2$ non-conductive. Hence, the current supplied from the current source I flows in the light emitting diode LED, and the optical signal output rises accordingly.

When the input signal SD falls, the transistor $Q_1$ is rendered non-conductive to interrupt the application of current to the light emitting diode LED. At the same time the inverted signal $\overline{SD}$ of the input signal rises to render the transistor $Q_2$ conductive, and therefore current flows in the conductive transistor $Q_2$.

In the light emitting element drive circuit, the collector output of the transistor $Q_2$ is applied to the base of the transistor $Q_4$ through the differentiating circuit consisting of the resistor $R_2$ and the capacitor $C_2$. Hence, when the signal $\overline{SD}$ rises to render the transistor $Q_2$ conductive, the capacitor $C_2$ is discharged to apply a forward bias to the transistor $Q_4$. As a result, the transistor $Q_4$ is rendered conductive so that the light emitting diode LED is discharged through the conductive transistor $Q_4$.

In the light emitting element drive circuit operating in the above-described manner, a node (A) which is the input terminal of the differentiating circuit is sufficiently low in impedance because it is the collector of the transistor $Q_2$. The node (A) is isolated from node (B) which is a signal input terminal which receives signals to directly control the drive current flowing in the light emitting diode LED and node (C) which is a current discharge path for the drive current of the light emitting diode LED. Hence, the problem of the waveform of the output optical signal of the light emitting diode LED being distorted by so-called "back gating" is eliminated.

The node 50 which is low in impedance and the node (C) operate in a differential mode so that the noise induced by the circuit is decreased.

Figure 2:
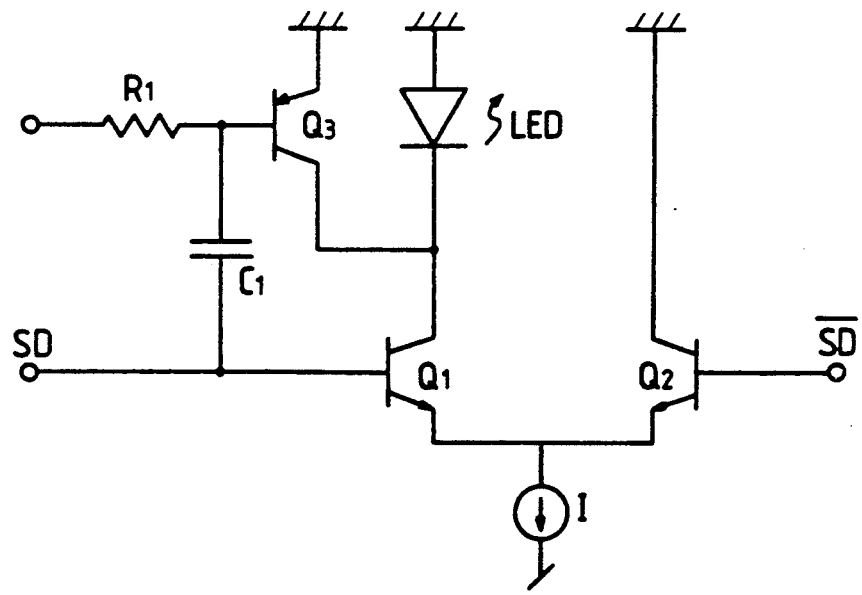
FIG. 2 is a circuit diagram showing a typical example of the arrangement of a conventional light emitting element drive circuit.

FIG. 3 shows the details of the conventional light emitting element drive circuit in FIG. 2, and FIG. 4 shows the details of the light emitting element drive circuit in FIG. 1. In these circuits, the capacitance of the LED is set to 100 pF, r is 200 Ω, C is 10 pF, and I is 50 mA. Under this condition, in the circuit of FIG. 3, the voltage waveforms $V_A$ and $V_B$ at nodes A and B, and the waveform $I_{Q1}$ of the current flowing through the Q1 are as shown in FIGS. 5(a), 5(b) and 5(c), respectively. On the other hand, in the circuit of FIG. 4, the voltage waveforms $V_A$ and $V_B$ and the current waveform $I_{Q1}$ are as shown in FIGS. 6(a), 6(b) and 6(c), respectively. Thus, compared with the conventional circuit, the signal waveform obtained by the circuit of the present invention has no distortion.

Figure 7:
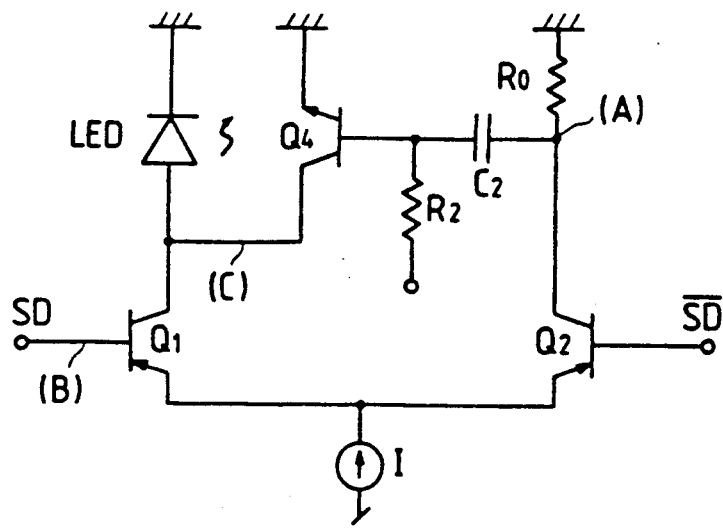
FIGS. 7 to 9 show modified embodiments of the light emitting element drive circuit in FIG. 1, respectively.

In the above-described light emitting element drive circuit, as shown in FIG. 7, the first and second NPN transistors may be replaced by first and second PNP transistors, and the PNP transistor may be replaced by an NPN transistor, with the collector of the NPN transistor being connected to the anode of the light emitting element instead of to the cathode of the light emitting element.

Figure 8:
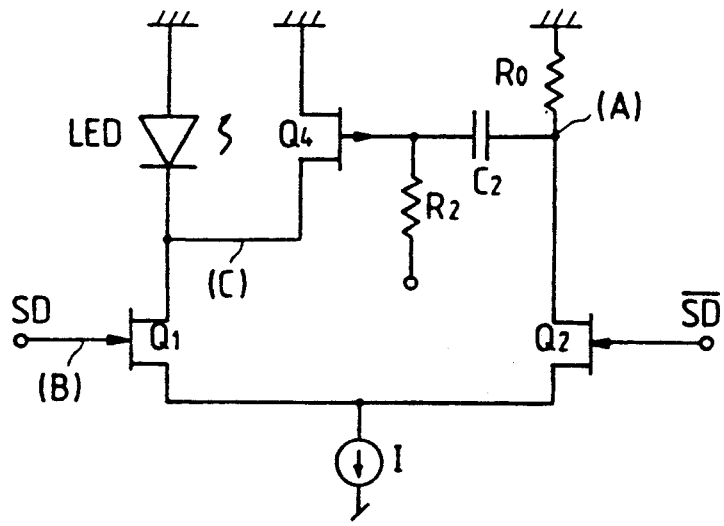
Figure 9:
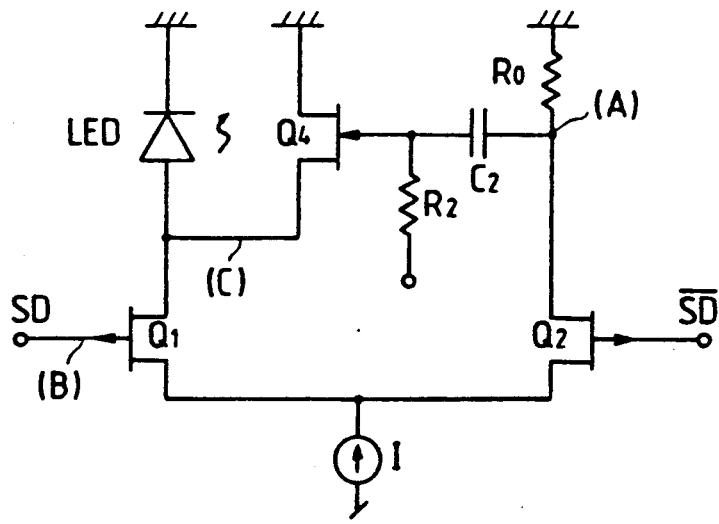

Further, in the light emitting element drive circuits of FIGS. 1 and 7, as shown in FIGS. 8 and 9, the NPN transistors and the PNP transistors may be replaced by N-channel FETs and P-channel FETs, respectively.

As is apparent from the above description, the light emitting element drive circuit arrangement can decrease the current consumption and suppress the distortion of the output optical signal by having the specific feature of the complementary drive system which greatly suppresses the hemming of the signal waveform at the de-activation of the light emitting element.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A light emitting element drive circuit comprising:
   current source circuit means for providing a current signal;
   a light emitting element having first and second terminals, said first terminal being connected to a first voltage;
   a first transistor having a base for receiving an input signal, a collector connected to said light emitting element second terminal, and an emitter connected to said current source circuit means;
   a second transistor having a base for receiving an inverted signal corresponding to said input signal, a collector connected to said first voltage, and an emitter connected to said current source circuit means;
   a third transistor for providing a current discharge path for said light emitting element, having a collector connected to said second terminal of said light emitting element and an emitter connected to said first voltage; and
   differentiating circuit means coupled to said third transistor base for energizing said third transistor in accordance with said inverted signal, said differentiating circuit comprising:
   a capacitor having a first terminal connected to said second transistor collector; and
   a resistor having a first terminal connected to a second terminal of said capacitor, a bias being applied to a second terminal of said resistor.

2. A light emitting element drive circuit as in claim 1, wherein
   said first and second transistors are NPN transistors;
   said third transistor is a PNP transistor; and
   said first terminal of said light emitting element is an anode and said second terminal of said light emitting element is a cathode.

3. A light emitting element drive circuit as in claim 1, wherein
   said first and second transistors are PNP transistors;
   said third transistor is an NPN transistor; and
   said first terminal of said light emitting element is a cathode and said terminal of said light emitting element is an anode.

4. A light emitting element drive circuit comprising:
   current source circuit means for providing a current signal;
   a light emitting element having first and second terminals, said first terminal being connected to a first voltage;
   a first transistor having a gate for receiving an input, a drain connected to said light emitting element second terminal, and a source being connected to said current source circuit means;
   a second transistor having a gate for receiving an inverted signal corresponding to said input signal, a drain connected to said first voltage, and a source connected to said current source circuit means;
   a third transistor for providing a current discharge path for said light emitting element, having a drain connected to said second terminal of said light emitting element, and a source connected to said first voltage; and
   differentiating circuit means coupled to said third transistor gate for energizing said third transistor in accordance with said inverted signal, said differentiating circuit comprising:
   a capacitor having a first terminal connected to said second transistor drain and;
   a resistor having a first terminal connected to a second terminal of said capacitor, a bias being applied to a second terminal of said resistor.

5. A light emitting element drive circuit as in claim 4, wherein
   said first and second transistors are N-channel FETs;
   said third transistor is a P-channel FET; and
   said first terminal of said light emitting element is an anode and said second terminal of said light emitting element is a cathode.

6. A light emitting element drive circuit as in claim 4, wherein
   said first and second transistors are P-channel FETs;
   said third transistor is an N-channel FET; and
   said first terminal of said light emitting element is a cathode and said second terminal of said light emitting element is an anode.

* * * * *